United States Patent
Ni

(10) Patent No.: US 10,535,505 B2
(45) Date of Patent: Jan. 14, 2020

(54) PLASMA LIGHT UP SUPPRESSION

(71) Applicant: Lam Research Corporation, Fremont, CA (US)

(72) Inventor: Pavel Ni, Fremont, CA (US)

(73) Assignee: Lam Research Corporation, Fremont, CA (US)

(*) Notice: Subject to any disclaimer, the term of this patent is extended or adjusted under 35 U.S.C. 154(b) by 399 days.

(21) Appl. No.: 15/349,918

(22) Filed: Nov. 11, 2016

(65) Prior Publication Data

US 2018/0138021 A1 May 17, 2018

(51) Int. Cl.
| | |
|---|---|
| H01J 37/32 | (2006.01) |
| H01L 21/683 | (2006.01) |
| H01L 23/00 | (2006.01) |
| H01L 21/67 | (2006.01) |
| H01L 21/02 | (2006.01) |
| H01L 21/3065 | (2006.01) |

(52) U.S. Cl.
CPC .... *H01J 37/32724* (2013.01); *H01J 37/3244* (2013.01); *H01J 37/32082* (2013.01); *H01L 21/6831* (2013.01); *H01L 23/562* (2013.01); *H01J 2237/334* (2013.01); *H01L 21/02274* (2013.01); *H01L 21/3065* (2013.01); *H01L 21/67017* (2013.01); *H01L 21/67109* (2013.01)

(58) Field of Classification Search
CPC ............. H01J 37/32724; H01J 37/3244; H01J 37/32082; H01J 2237/334; H01L 21/67109; H01L 21/6831; H01L 23/562
See application file for complete search history.

(56) References Cited

U.S. PATENT DOCUMENTS

| | | | | |
|---|---|---|---|---|
| 2,867,679 A | * | 1/1959 | Cobine | H02K 9/12 |
| | | | | 174/16.1 |
| 5,153,397 A | * | 10/1992 | Seki | H01H 33/91 |
| | | | | 218/62 |
| 5,955,823 A | * | 9/1999 | Nilsson | A61B 8/546 |
| | | | | 310/344 |
| 6,016,023 A | * | 1/2000 | Nilsson | G10K 11/004 |
| | | | | 310/334 |
| 7,393,460 B2 | | 7/2008 | Hori et al. | |

(Continued)

FOREIGN PATENT DOCUMENTS

| | | | | |
|---|---|---|---|---|
| CN | 108087735 A | * | 5/2018 | ............. F21K 9/232 |
| WO | 01-08209 | | 2/2001 | |

OTHER PUBLICATIONS

International Search Report from International Application No. PCT/JP2017/057454 dated Feb. 7, 2018.

(Continued)

*Primary Examiner* — Jeffrie R Lund
(74) *Attorney, Agent, or Firm* — Beyer Law Group LLP

(57) ABSTRACT

A method for suppressing arcing in helium distribution channels of an electrostatic chuck in a plasma processing chamber, wherein the electrostatic chuck is connected to a voltage source for providing a chucking voltage and wherein the plasma processing chamber comprises a process gas source, and a plasma power source for transforming the process gas into a plasma is provided. A gas is flowed through the helium distribution channels of an electrostatic chuck to a back side of a wafer. The gas comprises helium and an electronegative gas.

11 Claims, 3 Drawing Sheets

(56) References Cited

U.S. PATENT DOCUMENTS

| | | | |
|---|---|---|---|
| 7,622,017 B2* | 11/2009 | Himori | H01L 21/6831 118/663 |
| 2004/0085706 A1* | 5/2004 | Tomoyoshi | H01L 21/67109 361/234 |
| 2004/0107906 A1* | 6/2004 | Collins | H01J 37/32082 118/723 I |
| 2004/0107908 A1* | 6/2004 | Collins | H01J 37/32082 118/723 I |
| 2004/0177927 A1* | 9/2004 | Kikuchi | H01J 37/32174 156/345.51 |
| 2004/0187788 A1* | 9/2004 | Kellerman | C23C 16/4586 118/728 |
| 2005/0011456 A1* | 1/2005 | Himori | H01L 21/6831 118/724 |
| 2005/0041364 A1* | 2/2005 | Kellerman | H01L 21/6833 361/234 |
| 2005/0099758 A1* | 5/2005 | Kellerman | H01L 21/6833 361/234 |
| 2006/0037707 A1* | 2/2006 | Muramoto | B32B 37/0015 156/382 |
| 2006/0171093 A1* | 8/2006 | Ishimura | H01J 37/321 361/234 |
| 2007/0048954 A1* | 3/2007 | Kato | H01J 37/32192 438/308 |
| 2008/0182418 A1 | 7/2008 | Collins et al. | |
| 2010/0193130 A1* | 8/2010 | Kawakami | H01L 21/67109 156/345.37 |
| 2010/0216317 A1 | 8/2010 | Tjandra et al. | |
| 2010/0326602 A1* | 12/2010 | Bluck | H01L 21/6831 156/345.53 |
| 2010/0326957 A1* | 12/2010 | Maeda | H01J 37/20 216/67 |
| 2011/0024049 A1 | 2/2011 | Stevenson et al. | |
| 2011/0174784 A1* | 7/2011 | Kamei | B23K 1/14 219/74 |
| 2012/0152895 A1* | 6/2012 | Chebi | B81C 1/00619 216/37 |
| 2014/0166622 A1* | 6/2014 | Abe | H02B 13/0655 218/139 |
| 2014/0302681 A1* | 10/2014 | Paterson | H01L 21/3065 438/710 |
| 2015/0090692 A1* | 4/2015 | Sasaki | H01J 37/32724 216/67 |
| 2015/0211123 A1* | 7/2015 | Glukhoy | C23C 16/453 118/712 |
| 2016/0155586 A1* | 6/2016 | Ashtekar | H01H 1/02 218/43 |
| 2016/0289832 A1 | 10/2016 | Xia et al. | |
| 2017/0263462 A1* | 9/2017 | Okita | H01L 21/3065 |
| 2018/0138021 A1* | 5/2018 | Ni | H01J 37/32082 |

OTHER PUBLICATIONS

Written Opinion from International Application No. PCT/JP2017/057454 dated Feb. 7, 2018.

* cited by examiner

PLASMA LIGHT UP SUPPRESSION

BACKGROUND

The disclosure relates to a method and apparatus for forming semiconductor devices on a semiconductor wafer. More specifically, the disclosure relates to light up suppression in a substrate support during the formation of semiconductor devices.

Semiconductor processing systems are used to process substrates such as semiconductor wafers. Example processes that may be performed on such systems include, but not limited to, conductor etch, dielectric etch, atomic layer deposition, chemical vapor deposition, and/or other etch, deposition or cleaning processes. A substrate may be arranged on a substrate support, for example, a pedestal, an electrostatic chuck (ESC), in a processing chamber of the semiconductor processing system. A substrate support may include a ceramic layer with embedded heaters, high voltage electrodes and also a base plate bonded to the ceramic layer. A substrate support may further include helium distribution channels for supplying helium to the backside of a wafer to control the thermal conductivity between a substrate and a substrate support. Semiconductor processing systems may implement plasma processes (e.g., plasma etch processes) that require high RF power which will cause high voltages to appear at a substrate support. The increase in voltage applied across the substrate support may cause undesired effects such as arcing or gas light up in helium distribution channels and/or other cavities of the substrate support. Light up may damage the semiconductor devices and the processing chamber, create particle defects on the wafer, damage semi-conductor devices on a wafer, etc., thus increasing costs and equipment down time and decreasing product yield.

SUMMARY

To achieve the foregoing and in accordance with the purpose of the present disclosure, a method for suppressing arcing in helium distribution channels of an electrostatic chuck in a plasma processing chamber, wherein the electrostatic chuck is connected to a voltage source for providing a chucking voltage and wherein the plasma processing chamber comprises a process gas source, and a plasma power source for transforming the process gas into a plasma is provided. A gas is flowed through the helium distribution channels of an electrostatic chuck to a back side of a wafer. The gas comprises helium and an electronegative gas.

In another manifestation, an apparatus for plasma processing a wafer is provided. An electrostatic chuck is provided for supporting a wafer, wherein the electrostatic chuck has helium distribution channels for providing a cooling gas to a backside of the wafer. A helium and electronegative gas source is in fluid connection with the helium distribution channels.

These and other features of the present invention will be described in more details below in the detailed description of the invention and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
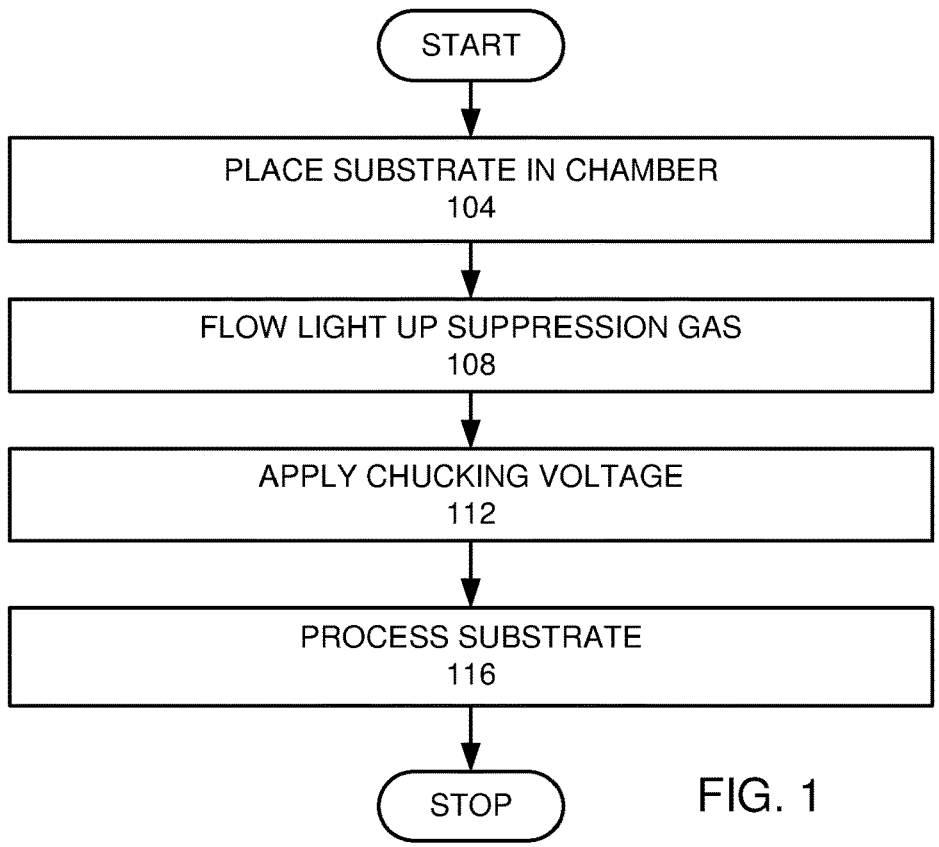
FIG. 1 is a high level flow chart of an embodiment.

FIG. 1 is a high level flow chart of an embodiment. In this embodiment, a substrate is placed in a processing chamber on an electrostatic chuck (step 104). A light up suppression gas is flowed through the electrostatic chuck to cool a backside of the substrate (step 108). A chucking voltage is applied (112). The substrate is processed (step 116).

Example

Figure 2:
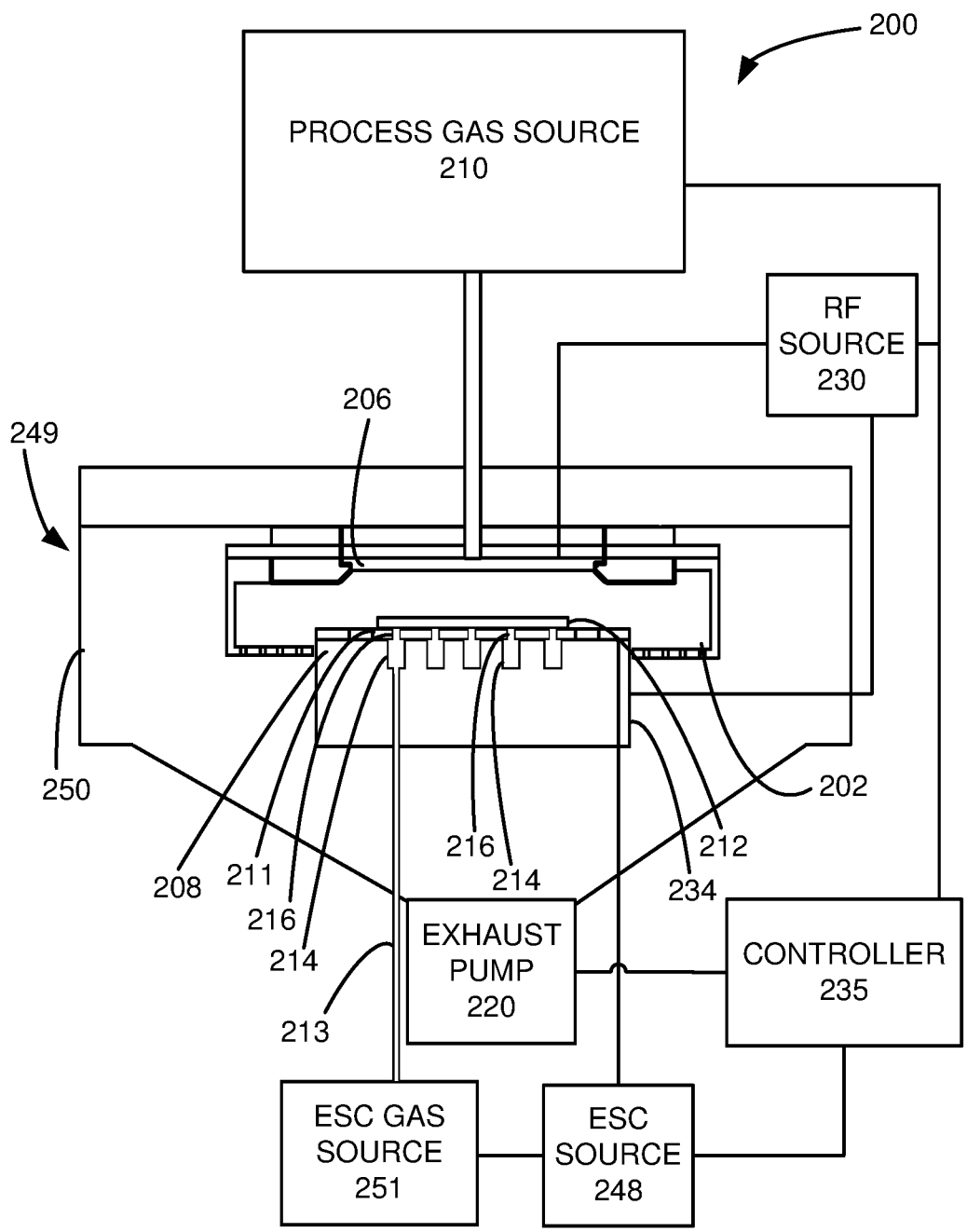
FIG. 2 is a schematic view of a plasma processing chamber that may be used in an embodiment.

In a preferred embodiment of the invention, a substrate is placed in a processing chamber on an electrostatic chuck (step 104). FIG. 2 is a schematic view of a plasma processing chamber that may be used in an embodiment. In one or more embodiments, the plasma processing system 200 comprises a gas distribution plate 206 providing a gas inlet and an electrostatic chuck (ESC) 208, within a processing chamber 249, enclosed by a chamber wall 250. Within the processing chamber 249, a substrate 212 is positioned on top of the ESC 208. The ESC 208 may provide a chucking voltage from the ESC source 248. A process gas source 210 is connected to the processing chamber 249 through the distribution plate 206. An ESC gas source 251 provides an ESC gas through an inlet 213 to helium distribution channels 214. The helium distribution channels are in fluid connection with coolant ports 216 to provide coolant to the backside of the substrate 212 to control the thermal conductivity between the substrate 212 and the ESC 208. An RF source 230 provides RF power to a lower electrode 234. In this embodiment, an upper electrode is the gas distribution plate 206. In a preferred embodiment, 400 kHz, 2 MHz, 60 MHz, and 27 MHz power sources make up the RF source 230. In this embodiment, one generator is provided for each frequency. In other embodiments, the generators may be in separate RF sources, or separate RF generators may be connected to different electrodes. For example, the upper electrode may have inner and outer electrodes connected to different RF sources. Other arrangements of RF sources and electrodes may be used in other embodiments, such as in another embodiment the upper electrodes may be grounded. A controller 235 is controllably connected to the RF source 230, the ESC source 248, an exhaust pump 220, the ESC gas source 251, and the process gas source 210. An example of such a plasma processing chamber is the Exelan Flex™ etch system manufactured by Lam Research Corporation of Fremont, Calif. The process chamber can be a CCP (capacitive coupled plasma) reactor or an ICP (inductive coupled plasma) reactor.

Figure 3:
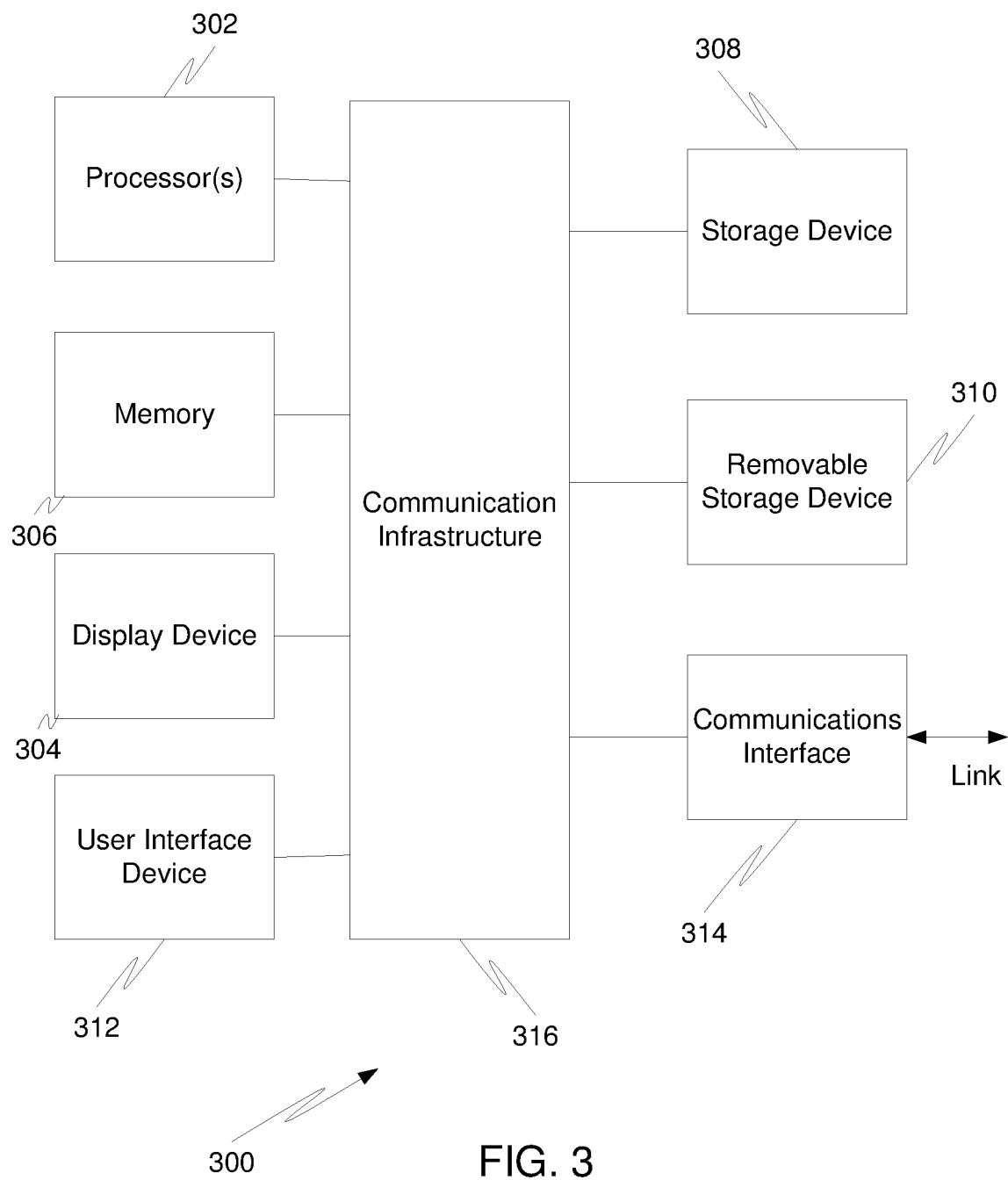
FIG. 3 is a schematic view of a computer system that may be used in practicing an embodiment.

FIG. 3 is a high level block diagram showing a computer system 300, which is suitable for implementing a controller 235 used in embodiments of the present invention. The computer system may have many physical forms ranging from an integrated circuit, a printed circuit board, and a small handheld device, up to a huge super computer. The computer system 300 includes one or more processors 302, and further can include an electronic display device 304 (for displaying graphics, text, and other data), a main memory 306 (e.g., random access memory (RAM)), storage device 308 (e.g., hard disk drive), removable storage device 310 (e.g., optical disk drive), user interface devices 312 (e.g., keyboards, touch screens, keypads, mice or other pointing devices, etc.), and a communication interface 314 (e.g., wireless network interface). The communication(s) interface 314 allows software and data to be transferred between the computer system 300 and external devices via a link. The system may also include a communications infrastructure 316 (e.g., a communications bus, cross-over bar, or network) to which the aforementioned devices/modules are connected.

Information transferred via communications interface 314 may be in the form of signals such as electronic, electromagnetic, optical, or other signals capable of being received by communications interface 314, via a communication link that carries signals and may be implemented using wire or cable, fiber optics, a phone line, a cellular phone link, a radio frequency link, and/or other communication channels. With such a communications interface, it is contemplated that the one or more processors 302 might receive information from a network, or might output information to the network in the course of performing the above-described method steps. Furthermore, method embodiments of the present invention may execute solely upon the processors or may execute over a network such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM, and other forms of persistent memory, and shall not be construed to cover transitory subject matter, such as carrier waves or signals. Examples of computer code include machine code, such as one produced by a compiler, and files containing higher level code that are executed by a computer using an interpreter. Computer readable media may also be computer code transmitted by a computer data signal embodied in a carrier wave and representing a sequence of instructions that are executable by a processor.

In this example, a light up suppression gas consisting essentially of helium and oxygen is flowed from the ESC gas source 251 to the helium distribution channels in an ESC 214 (step 108). In this example, the light up suppression gas is 1% to 30% oxygen, with the remaining gas being helium. In an example, the light up suppression gas is flowed through the helium distribution channels 214 at a pressure of 10 to 80 torr.

A chucking voltage is applied (step 112). In this example, chucking voltage of −2000 to −2900 volts is provided.

The substrate is processed (step 116). In this example, the process is a dielectric etch process. In this example, a process gas comprising 18 sccm $C_4F_8$, 19 sccm $O_2$, and 400 sccm Ar is flowed from the process gas source 210 into the processing chamber 249, while a chamber pressure of 70 to 90 mTorr is maintained. RF power is provided to form the process gas into a plasma. In this example, 3000 Watts is provided at 2 MHz, 1500 Watts is provided at 27 MHz, and 500 Watts is provided at 60 MHz. High chucking voltages are used as plasma self biasing voltages increase. In this example, the light up suppression gas prevented light up. No arcing traces were observed at a backside of a wafer that was processed.

To test the effectiveness of the addition of oxygen, the same process was performed using pure He instead of the light up suppression gas. In such a test, light up occurred. This shows that the addition of oxygen to the helium distribution gas made a difference to suppress or eliminate light up.

It would not be obvious to add oxygen to helium, since oxygen had been viewed as being detrimental when added with helium, because oxygen reduces thermal contact between ESC and wafer, and would leak into the process chamber, which might change the process. In various experiments it was found that the addition of oxygen did not cause any loss of clamping and temperature distribution compared to using pure helium. Clamping is needed to hold the substrate to the electrostatic chuck. Since thermal diffusivity is proportional to the inverse of the square root of the molecular mass, a gas consisting essentially of oxygen and helium has less thermal diffusivity than helium alone. Various experiments have found that the addition of oxygen did not impact thermal diffusivity enough to affect temperature of the wafer. In addition, some oxygen may leak into the processing chamber. It was found that the small amount of oxygen leakage was not significantly detrimental to the process.

Processing substrates using extreme electrical voltage values has, in the prior art, caused arcing in the helium distribution channels. Such arcing damages both the substrate and the processing chamber. This results in device defects in addition to lost time repairing the damaged processing chamber. Various apparatus and methods have been used to reduce arcing. However, such apparatus and methods are not completely effective or may interfere with the process. In addition, such devices are complex and expensive.

Without being bound by theory, it is believed that since oxygen is an electronegative gas, the addition of oxygen suppresses discharge by capturing free electrons, thus inhibiting discharge. Free electrons in the gas are necessary to ignite plasma; if these electrons are removed, no arcing can occur. Electronegative gases (such as oxygen, fluorine, chlorine, etc.) are believed to capture free electrons, making them attached to an atom. Once bound the formerly free electrons cannot contribute into the arcing event. Hence, the introduction of an electronegative gas into the flow of the main cooling gas reduces the number of free electrons below threshold levels necessary to sustain a plasma discharge. In other embodiments, other electronegative gases such as fluorine, chlorine, and $SiH_4$ may be used. However, oxygen is preferred since oxygen is less hazardous and less chemically reactive. In the specification and claims, a gas that is electronegative has an electronegativity on a Pauline scale of at least 3.00.

Various embodiments reduce or eliminate damage due to light up (arcing in the helium distribution channels), which reduces damage to the wafer and device defects. It also increases productivity and provides for a greater safe operational parameter space. Providing greater safe operational parameters allows for a wider range of processes that may be performed by the process chamber. The lifetime of the processing chamber is also extended.

Figure 4:
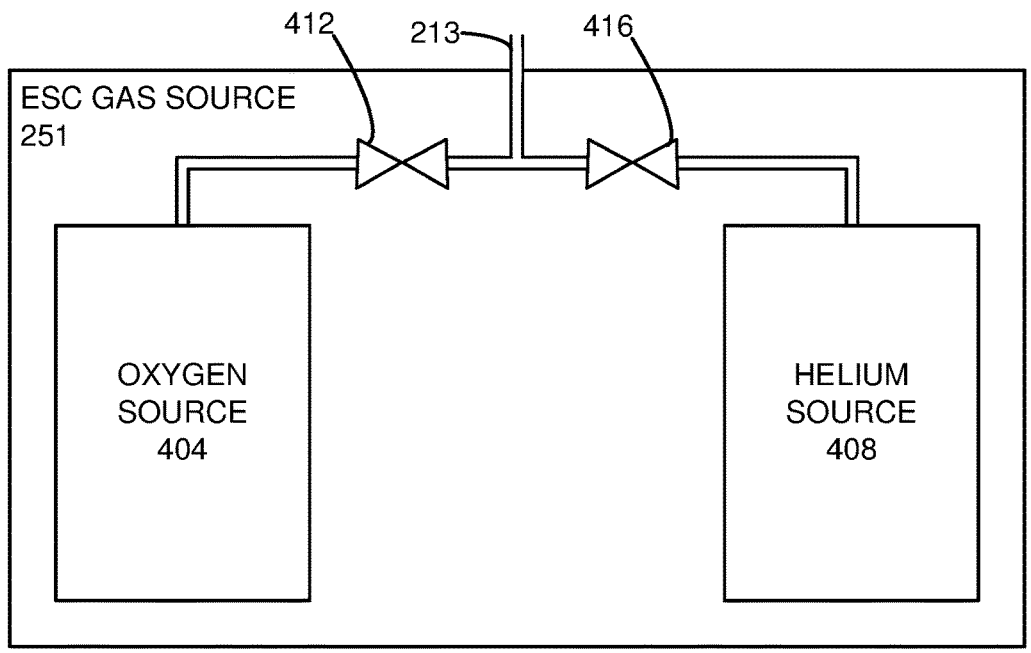
FIG. 4 is an enlarged schematic view of an ESC gas source in another embodiment.

In one embodiment, the ESC gas source may be a single source of both oxygen and helium, such as a container with a mixture of helium and oxygen, where oxygen is 1% to 30% of the total gas measured by a ratio of moles of oxygen divided by the total number of moles. FIG. 4 is an enlarged schematic view of an ESC gas source in another embodiment. In this embodiment, the ESC gas source 251 comprises an oxygen source 404 and a helium source 408. The oxygen source 404 is connected to an oxygen valve 412. The helium source 408 is connected to a helium valve 416. The oxygen valve 412 and helium valve 416 are connected to the inlet 213. In this example since there is a separate oxygen source 404 and helium source 408 the oxygen valve 412 and the helium valve 416 may be used to provide the desired helium to oxygen flow ratio.

Preferably, an RF average power of more than 3,000 Watts is provided. In some embodiments, the RF power is provided at 7,000 to 40,000 Watts. More preferably, the RF power is provided at 5,000 to 20,000 Watts. In various embodiments, the chucking voltage has a magnitude of at least 500 volts. More preferably, the chucking voltage has a magnitude of at least 2000 volts. More preferably, various embodiments have a chucking voltage between −2000 volts to −3000 volts.

Other embodiments may be used in an inductively coupled process chamber. Other embodiments may use an electrostatic chuck with inner and outer heating zones. To provide inner and outer zones, seal bands may be raised ridges that isolate inner and outer zones. In addition, mesas may be placed between the seal bands and may provide additional support.

While this invention has been described in terms of several preferred embodiments, there are alterations, modifications, permutations, and various substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and various substitute equivalents as fall within the true spirit and scope of the present invention.

What is claimed is:

1. A method for suppressing arcing in helium distribution channels of an electrostatic chuck in a plasma processing chamber, wherein the electrostatic chuck is connected to a voltage source for providing a chucking voltage and wherein the plasma processing chamber comprises a process gas source, and a plasma power source for transforming the process gas into a plasma, comprising:

flowing a gas through the helium distribution channels of the electrostatic chuck to a back side of a wafer, wherein the gas comprises:

helium to cool the back side of the wafer; and an electronegative gas for suppressing arcing in helium distribution channels of the electrostatic chuck in the plasma processing chamber.

2. The method, as recited in claim 1, wherein the electronegative gas comprises at least one of $O_2$, $F_2$, $Cl_2$, or $SiH_4$.

3. The method, as recited in claim 2, further comprising:

applying a chucking voltage from the voltage source;

flowing a process gas from the process gas source to a front side of the wafer; and forming the process gas into a plasma.

4. The method, as recited in claim 3, wherein the chucking voltage has a magnitude of at least 500 volts.

5. The method, as recited in claim 4, wherein the forming the process gas into a plasma comprises providing more than 3,000 watts RF average power from the plasma power source to the process gas.

6. The method, as recited in claim 5, wherein the cooling gas consists essentially of He and $O_2$.

7. The method, as recited in claim 1, further comprising:

applying a chucking voltage from the voltage source;

flowing a process gas from the process gas source to a front side of the wafer; and forming the process gas into a plasma.

8. The method, as recited in claim 7, wherein the forming the process gas into a plasma comprises providing more than 3,000 watts RF average power from the plasma power source to the process gas.

9. The method, as recited in claim 1, wherein the chucking voltage has a magnitude of at least 500 volts.

10. The method, as recited in claim 1, wherein the cooling gas consists essentially of He and $O_2$.

11. The method, as recited in claim 1, wherein the electronegative gas comprises oxygen, wherein the oxygen is 1% to 30% of the gas measured by a ratio of moles.

* * * * *